United States Patent [19]
Tao

[11] Patent Number: 6,166,574
[45] Date of Patent: Dec. 26, 2000

[54] CIRCUIT FOR TURNING ON AND OFF A CLOCK WITHOUT A GLITCH

[75] Inventor: Shin-Chu Tao, San Jose, Calif.

[73] Assignee: Silicon Storage Technology, Inc., Sunnyvale, Calif.

[21] Appl. No.: 09/251,718

[22] Filed: Feb. 17, 1999

[51] Int. Cl.[7] ........................................... H03K 5/01
[52] U.S. Cl. .............................. 327/166; 327/161
[58] Field of Search ..................... 327/141, 144, 327/146, 152, 153, 155, 161, 166, 176, 250, 218, 225

[56] References Cited

U.S. PATENT DOCUMENTS

| | | | |
|---|---|---|---|
| 4,740,998 | 4/1988 | House | 327/166 |
| 4,926,451 | 5/1990 | Yoshihara et al. | 327/155 |
| 5,083,049 | 1/1992 | Kagey | 327/141 |
| 5,825,834 | 10/1998 | Chambers et al. | 327/161 |
| 5,900,754 | 5/1999 | Nakatani | 327/158 |

*Primary Examiner*—My-Trang Nu ton
*Attorney, Agent, or Firm*—Limbach & Limbach L.L.P.

[57] ABSTRACT

A clock control circuit prevents glitches when turning a clock signal back on after being turned off following a period of system inactivity and includes a first flip-flop, a second flip-flop, and a NAND gate. The first flip-flop receives a direct input beginclk signal and a clock-triggered stopclk signal. The first flip-flop also has an output $Q_1$. A change in the beginclk signal is indicative of the start of a clock signal. The periodic signal is for triggering the storage of the stopclk signal in the first flip-flop. The second flip-flop receives the direct input beginclk signal and the output $Q_1$ of the first flip-flop as a clock-triggered input. The second flip-flop also has an output $\bar{Q}_2$. The periodic signal is also for triggering the storage of the output $Q_1$ of the first storage element in the second storage element. The NAND gate receives the output $\bar{Q}_2$ of the second flip-flop as a first input. The output $Q_3$ of the NAND gate is connected through a delay line to a second input of the NAND gate in a feedback arrangement. The output $Q_3$ is the clock signal.

14 Claims, 1 Drawing Sheet

CIRCUIT FOR TURNING ON AND OFF A CLOCK WITHOUT A GLITCH

BACKGROUND OF THE INVENTION

1. Field of the Invention

The invention relates to a clock control circuit for a digital system, and particularly to a circuit for turning on and off a clock without a glitch.

2. Discussion of the Related Art

Integrated circuits (ICs) typically comprise multiple combinatorial and sequential logic circuits. Combinatorial logic circuits contain logic gates, but not storage elements, and their outputs depend only on present inputs to the circuit. Sequential logic circuits contain memory storage elements in addition to gates, and their outputs depend on prior inputs as well as current inputs. The order in which data is latched among the elements of a sequential logic circuit will thus affect the output of the circuit.

Asynchronous latches respond whenever an input signal is applied and are referred to as having "direct" inputs. A system using several such latches will have inputs arriving at various times. It is often desired, however, to use synchronous latches to ensure simultaneity and certainty in the temporal ordering of latch responses, such as with ICs containing sequential logic circuits. In these circuits, a common synchronizing clock signal is used which triggers the synchronous latches at rising (positive) and/or falling (negative) edges of its periodic waveform. Synchronized latches are thus referred to as having "clock-triggered" inputs.

Clock signals are typically generated by one or more crystals which undergo atomic oscillations at known frequencies. It is typically desired to have multiple clock frequencies for use with various sub-circuits within a single digital system. For simple circuits, it may be sufficient to use a number of different crystals each having a different frequency of oscillation. However, for complex ICs, a clocking schedule is typically employed wherein sophisticated clock signal delay and clock and input signal skewing techniques are used to stretch clock and/or input signal periods to meet the needs of each particular sub-circuit of the IC.

Delays may be produced at junctions and by varying inductances, resistances, and current densities. Delays may be incurred during transmission, propagation or queuing of signals. Josephson transmission lines have been used as well with superconducting circuitries to promote delay. Clock and input signal skewing involves a stretching of the signal period to reduce the frequency of a clock signal.

One of the goals of synthesizing a clocking schedule is to minimize the probability of "glitches" occurring during the operation of an IC. A glitch can occur when the outputs of a circuit have random values for a brief time before they settle down to correct values. If another circuit inspects the output at just the wrong time and reads the random value, the results can be very wrong and difficult to debug. For example, a glitch was cited as the cause of a systems communication problem which halted trading on the NYSE for an hour in 1998. Glitches are also known to cause unpleasant "snapping" sounds when a process of "CD grabbing" occurs during a song. Glitches have caused momentary zero voltages across electrical mains and sudden voltage increases across capacitors causing steps in affected ramps, sometimes having lasting effects including extended tails.

A first specific type of digital glitch happens when a logic threshold transition occurs more than once between fixed or specified clock periods. That is, an input signal both rises and falls, or vice-versa, between triggering clock edges and is thus not captured by the clock trigger.

A second type of digital glitch arises when a clocking edge appears between two asynchronous inputs. For example, one of the two inputs may be read as a "1" instead of a "0", as desired or expected, or vice-versa, as the logic of the circuit would dictate, yielding erroneous results. In this second case, the first latch is clock-triggered before it has had time to successfully register its input. A logical error can result when the second sequential input in a logical sequence of two asynchronous inputs is triggered before the first input has successfully registered.

A third type of glitch affecting digital circuits occurs when an external signal effects the polarity of an input for an arbitrary duration. Such an external signal may be received from a nearby circuit or sub-component of the same IC, or from external magnetic or radiative sources such as fast moving electrons and ions within the earths magnetic field. A latch may trigger during the period of influence of a glitch of this third type, and produce an erroneous output.

On another front, many digital systems include means for monitoring a circuit to determine whether the circuit is actively receiving input data for processing. When it is determined that the circuit has been inactive for a specified period of time, the clock is turned off to save power, putting the circuit into a sleep, rest or hibernation mode. At a specified input event, the clock is turned back on and the circuit awakens to again perform processing activities. Some registers and latches require time to reset and resynchronize to predetermined logic states. If a clock trigger is received before one or more digital devices have reset and/or resynchronized, i.e., too soon after the input event triggers the system to awaken from its sleep, rest or hibernation state, a glitch may occur.

It is desired to have a circuit wherein a clock signal may be turned off, and then turned back on by a triggering input event, without incurring a glitch.

SUMMARY OF THE INVENTION

The present invention provides such a clock control circuit including a first storage element and a second storage element. The first storage element receives a direct input first signal, a periodic signal and a clock-triggered second signal. The first storage element also has an output $Q_1$. A change in $Q_1$ is indicative of the start of a clock signal. The periodic signal is also for triggering the storage of the second signal in the first storage element. The second storage element also receives the first signal, the periodic signal and the output $Q_1$ of the first storage element as a clock-triggered input. The second storage element also has an output $\overline{Q_2}$. The periodic signal is also for triggering the storage of the output $Q_1$ of the first storage element in the second storage element. The circuit further includes a logic gate which receives the output $\overline{Q_2}$ of the second storage element as a first input. The output $Q_3$ of the logic gate is connected through a delay line to a second input of the logic gate in a feedback arrangement. The output $Q_3$ is the clock signal.

DETAILED DESCRIPTION OF THE PREFERRED EMBODIMENT

Figure 1:
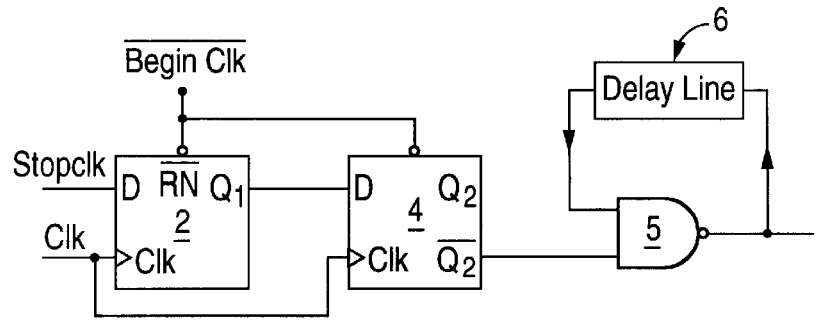
FIG. 1 shows a clock control circuit in accord with a preferred embodiment of the present invention.

A preferred embodiment of the clock control circuit of the present invention is shown in FIG. 1. The circuit includes a first flip-flop 2 and a second flip-flop 4, connected as shown, in a master-slave relationship. The first flip-flop 2 latches at a first clock pulse, and the second flip-flop 4 latches at the next or a subsequent clock pulse. The second flip-flop 4 thus latches one or more periods or clock cycles after the first flip-flop 2 latches. The clock inputs of the first flip-flop 2 and the second flip-flop 4 may be connected through an inverter such that the first flip-flop 2 latches at, e.g., a rising edge of a clock pulse, and the second flip-flop 4 then later latches at the falling edge of the same or a subsequent clock pulse. The second flip-flop 4 in this alternative approach then latches an odd number of half clock periods or cycles after the first flip-flop 2 latches. The flip-flops 2 and 4 are each preferably D flip-flops or D latches synchronized to respond at the rising and/or falling edges of the input clock signal (labelled "clk").

The first and second flip-flops 2,4 are each configured to receive the complement of a direct-input beginclock signal (labelled "beginclk") and are connected in parallel to the beginclk signal line. The beginclk signal is a direct set input to each flip-flop 2,4. That is, a clock trigger is not required to latch either of the first or second flip-flops 2,4 in response to receiving the beginclk signal. The beginclk signal is inactive high. The beginclk signal switches from high to low to begin a logical sequence intended to result in the turning on of the clock signal which had been turned off during a period of system inactivity. When the first and second flip-flops 2,4 each receive the beginclk signal, the output $Q_1$ goes from high to low and the output $\overline{Q_2}$ goes from low to high.

The first flip-flop 2 receives as clock-triggered stopclock input (labelled "stopclk"). The stopclk signal is inactive low such that the stopclk signal is low when the clock is on. When a high stopclk input is received, the output $Q_1$ of the first flip-flop 2 goes high at the next triggering clock edge. The output $Q_1$ of the first flip-flop 2 is received by the second flip-flop 4. At the next triggering clock edge, the output $Q_2$ thus goes high and the output $\overline{Q_2}$ goes low.

The $\overline{Q_2}$ low input is received by a NAND gate 5. Since the output $Q_3$ of the NAND gate 5 is low only when each of its inputs are high, the low $\overline{Q_2}$ input to the NAND gate 5 from the second flip-flop 4 causes the NAND gate output $Q_3$ to be high, notwithstanding the value of any other input to the NAND gate 5. Thus, as long as the $\overline{Q_2}$ input to the NAND gate 5 is low, the output $Q_3$ of the NAND gate will remain high. Since the output of the NAND gate 5 is to be used as a clock signal, the effect of the $\overline{Q_2}$ input to the NAND gate 5 becoming low is to cause the clock signal to turn off, or become inactive high. At this point, the clock signal, which is the output $Q_3$ of the NAND gate 5, will remain off, or inactive high, as long as the $\overline{Q_2}$ input to the NAND gate 5 remains low.

The output $Q_3$ of the NAND gate 5 is received as a second input by the NAND gate 5 via a delay line 6. This second input thus becomes high at a time after $Q_3$ becomes high, which time is determined by the amount of temporal delay on the delay line 6. The amount of delay is in turn determined by such factors as the speed of the flip flops 2,4. It is desired that the delay be around one nanosecond, depending on those other factors.

The second input to the NAND gate 5 will remain high unless the output $Q_3$ changes back to a low state. The output $Q_3$ will change back to a low state when the output $\overline{Q_2}$ of the second flip-flop 4, received as the first input to the NAND gate 5, goes high, since the second input to the NAND gate 5 is already inactive high. In the circuit of FIG. 1, the output $\overline{Q_2}$ changes from low to high when the beginclk signal changes from its inactive high state to a low state. The beginclk signal changes states from inactive high to low based on some predetermined triggering event external to the circuit of FIG. 1.

After the beginclk signal is received and the output $\overline{Q_2}$ of the second flip-flop 4 changes from low to high, the output $Q_3$ changes almost instantaneously from high to low. This is because the other input to the NAND gate 5 (the output $Q_3$ of the NAND gate 5) is still high. At a later time which is determined by the amount of delay in the delay line 6, the second input to the NAND gate 5 becomes low causing the output of the NAND gate 5 to go from low back to high. This transition, after the delay, of the output $Q_3$ of the NAND gate 5 going from low to high is the first positive clock edge after the beginclk signal is received by the flip-flop 2. Advantageously, the temporal difference between the time when the beginclk signal is received by the flip-flops 2 and 4 and the time when this first positive clock edge occurs is determined by the amount of delay in the delay line 6.

When the output $Q_3$ is used as a clock signal for a positive edge-triggered logic device, an advantage of the present invention is realized. That is, the timing of the first positive clock edge is delayed for a predetermined amount of time. During this period of delay after the beginclk signal is first received, any logic device receiving $Q_3$ as a clock input trigger has more time to reset and/or resynchronize into its proper logic state before it is latched by the $Q_3$ clock trigger. Glitches otherwise occurring in conventional systems due to logic devices being latched after a period of inactivity by first positive clock edge triggers before they have reset or resynchronized into their proper logic states are avoided in the present invention. The first positive clock edge triggering event is thus delayed to a later time from the time of the beginclk signal transition by the delay line 6. Moreover, the output $Q_3$ may continue to be used as a skewed clock trigger having a stretched period.

Figure 2:
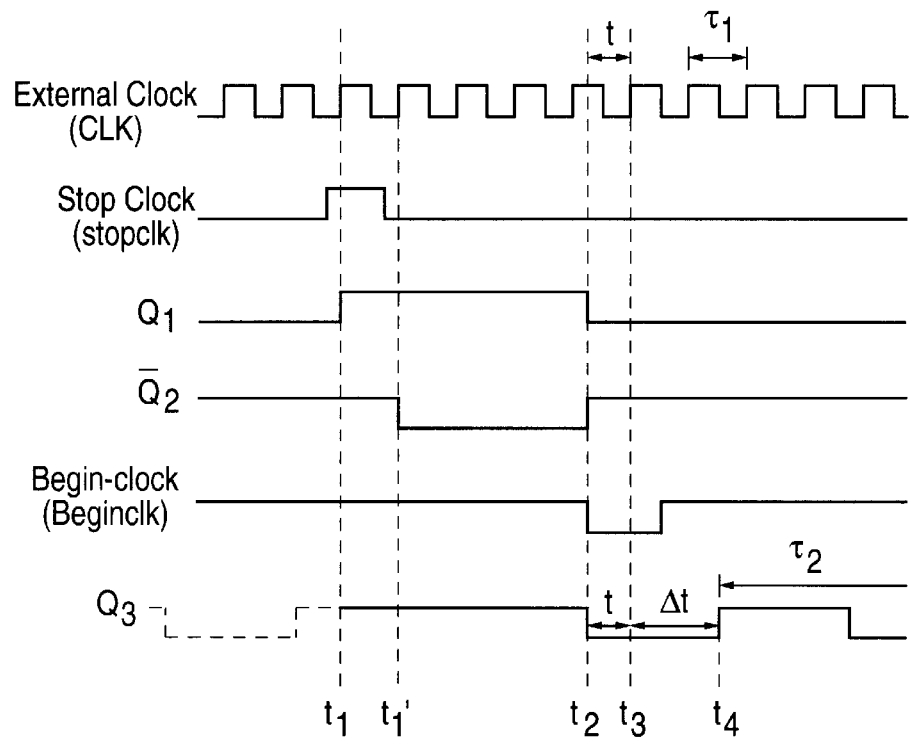
FIG. 2 shows a clocking scheme for the clock control circuit of FIG. 1 assuming positive clock-edge triggering.
Figure 3:
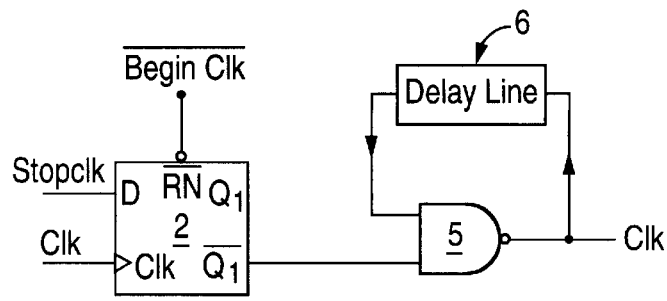
FIG. 3 shows a clock control circuit in accord with an alternative embodiment of the present invention.

FIG. 2 illustrates a timing diagram of the various signals provided to and generated from the circuit shown in FIG. 1. An external clock signal is shown having a period $\tau_1$. This clock signal might be used for logic devices wherein the clock signal produced by present invention is not otherwise used. A stopclock signal is input to the first flip-flop 2 of the system shown in FIG. 1. The stopclock signal may be synchronous or not synchronous. If the stopclock signal is synchronous, then it may be possible to realize the advantages of the present invention without the second flipflop 4, using only the first flip-flop 2, and having the complement of the output $Q_1$ of the first flip flop 2 perform the same function as is explained below regarding the output $\overline{Q_2}$ of the second flip-flop 4. FIG. 3 shows a clock control circuit in accord with this alternative embodiment of the present invention.

Assuming the stop clock signal is not synchronous and the circuit os FIG. 1 is used to realize the benefits of the present invention, then at the next triggering clock event for the first flip-flop 2, shown as the next positive clock edge occurring at time $t_1$, the first flip-flop 2 latches and $Q_1$ goes high, causing the input to the second flip-flop 4 to go high, in synchronous fashion. At the next triggering event of the second flip-flop 4 shown as the next positive clock edge occurring at time $t_1'$, the output $\overline{Q_2}$ of the second flip-flop 4 goes low. At the time $t_1'$ when $\overline{Q_2}$ goes low, if the current logic state of the output $Q_3$ is low, it almost instantaneously becomes high. If the current logic state of $Q_3$ is high as shown, it remains high.

The beginclk signal is shown to be inactive high from sometime before the time $t_1$ when the stopclk signal is latched by the first flip-flop 2 until a later time $t_2$ when a beginclk signal is received by the flip-flops 2 and 4. It is the transition of the beginclk signal from high to low which causes the output $Q_1$ of the first flip-flop to go high, the output $\overline{Q}_2$ of the second flip-flop 4 to go low and the output $Q_3$ of the NAND gate 5 to go low, each without any clock triggering event first being necessary.

If the external clock (clk) is being used to trigger a particular logic device, then that device will latch at a time $t_3$, a time t after the time $t_2$ when the beginclk signal was received. However, a logic device using $Q_3$ as its clock trigger will not see a first positive clock edge until a time $t_4$, a time $\Delta t$ after the time $t_3$, which is predetermined by the amount of delay set in the delay line. If a logic device continues to use $Q_3$ as its clock trigger, then such a device will continue to latch with a clocking frequency of $\tau_2$, which is determined by the amount of delay in the delay line 6, and not by the external clock frequency $\tau_1$. The output $Q_3$ will continue to oscillate with a period $\tau_2$ until another stopclk signal is received by the first flip-flop 2, and $Q_3$ returns to an inactive high state.

Multiple circuits similar to FIG. 1 having periodic outputs with varying periods $\tau_2, \tau_3, \tau_4$, etc., may be incorporated into a larger digital system. In this way, a complex clocking scheme or clock schedule may be utilized. In such a system, various inputs are triggered by selected clock signals having various clock frequencies so that particular device are latched at desired times. The probability of glitches occurring is reduced because triggering clock signals may be selected with a higher degree of predictability and versatility.

What is claimed is:

1. A clock control circuit, comprising:
   a first storage element for receiving a direct input first signal, a periodic signal and a second signal and having an output $Q_1$, wherein a change in said first signal is indicative of the start of a clock signal, and wherein said periodic signal is for triggering the storage of said second signal in said first storage element;
   a second storage element for receiving said direct input first signal, said periodic signal and said output $Q_1$ of said first storage element and having an output $\overline{Q}_2$; and
   a logic gate for receiving the output $\overline{Q}_2$ of the second storage element as a first input and having an output $Q_3$ which is connected through a delay line to a second input of the logic gate in a feedback arrangement, wherein said output $Q_3$ is said clock signal.

2. The clock control circuit of claim 1, wherein each of said first and second storage elements is a D flip-flop.

3. The clock control circuit of claim 1, wherein the first signal is inactive high.

4. The clock control circuit of claim 1, wherein the output $Q_3$ of the logic gate becomes a delayed clock signal after the first signal triggers the first and second storage elements and the output $\overline{Q}_2$ goes high.

5. The clock control circuit of claim 4, wherein the first signal triggers the first and second storage elements by going low from an inactive high state.

6. The clock control signal of claim 4, wherein the output $Q_3$ of the logic gate becomes an inactive high signal after the second signal triggers the first storage element, the output $Q_1$ goes high, and the output $\overline{Q}_2$ goes low.

7. The clock control circuit of claim 6, wherein the second signal triggers the first storage element by going high from an inactive low state.

8. A method of operating a clock control circuit including a logic gate, a first storage element and a second storage element, the first storage element for receiving a direct input first signal, a periodic signal and a second signal and having an output $Q_1$, the second storage element for receiving the direct input first signal, the periodic signal and the output $Q_1$ of the first storage element and having an output $\overline{Q}_2$, and the logic gate for receiving the output $\overline{Q}_2$ of the second storage element as a first input and having an output $Q_3$ which is connected through a delay line to a second input of the logic gate in a feedback arrangement, the method comprising the steps of:
   triggering the direct input first signal to go low, the output $\overline{Q}_2$ to go high, and the output $Q_3$ of the logic gate to go low and enter an oscillatory state; and
   outputting the oscillatory output $Q_3$ as a delayed clock signal.

9. The method of claim 8, further comprising the step of triggering the second signal to go high, the output $\overline{Q}_2$ to go low and the output $Q_3$ to go to an inactive high state.

10. A clock control circuit, comprising:
    first means for receiving a direct input first signal and a second signal and for outputting a third signal, wherein a change in said first signal is indicative of the start of a clock signal;
    means for triggering the storage of said second signal in said first means;
    second means for receiving said direct input first signal and said third signal and for outputting a fourth signal;
    third means for receiving the fourth signal, for outputting a fifth signal and for receiving said fifth signal in a feedback arrangement; and
    means for delaying said fifth signal after being output and before being received by said third means, wherein said fifth signal is said clock signal.

11. The clock control circuit of claim 10, wherein the first signal is inactive high.

12. The clock control circuit of claim 11, wherein said fifth signal becomes said clock signal after said first signal switches from inactive high to low and the fourth signal goes high.

13. The clock control signal of claim 12, wherein said fifth signal of becomes inactive high after said second signal switches from low to high, the third signal goes high, and the fourth signal goes low.

14. The clock control circuit of claim 13, wherein the second signal switches from inactive low to high before said third signal switches from low to high.

* * * * *